US008943374B2

(12) United States Patent
Lam et al.

(10) Patent No.: US 8,943,374 B2
(45) Date of Patent: *Jan. 27, 2015

(54) WRITING SCHEME FOR PHASE CHANGE MATERIAL-CONTENT ADDRESSABLE MEMORY

(75) Inventors: Chung H. Lam, Peekskill, NY (US); Jing Li, Ossining, NY (US); Robert K. Montoye, Rocheter, MN (US)

(73) Assignee: International Business Machines Corporation, Armonk, NY (US)

( * ) Notice: Subject to any disclaimer, the term of this patent is extended or adjusted under 35 U.S.C. 154(b) by 260 days.

This patent is subject to a terminal disclaimer.

(21) Appl. No.: 13/551,728

(22) Filed: Jul. 18, 2012

(65) Prior Publication Data

US 2014/0026008 A1 Jan. 23, 2014

(51) Int. Cl.
| G11C 29/00 | (2006.01) |
| G11C 13/00 | (2006.01) |
| G11C 15/04 | (2006.01) |
| G11C 29/44 | (2006.01) |
| G11C 29/32 | (2006.01) |

(52) U.S. Cl.
CPC .......... *G11C 13/0004* (2013.01); *G11C 15/046* (2013.01); *G11C 29/44* (2013.01); *G11C 13/0069* (2013.01); *G11C 29/32* (2013.01); *G11C 13/0097* (2013.01); *G11C 13/0064* (2013.01)
USPC .......................................... 714/718; 365/49.1

(58) Field of Classification Search
CPC ........... G11C 13/0004; G11C 13/0064; G11C 13/0069; G11C 13/0097; G11C 15/046; G11C 29/32; G11C 29/44
USPC .............................. 714/718, 721, 732; 365/49
See application file for complete search history.

(56) References Cited

U.S. PATENT DOCUMENTS

| 6,859,390 | B2 | 2/2005 | Pashmakov .................... 365/163 |
| 6,944,050 | B2 | 9/2005 | Kang et al. ..................... 365/158 |
| 7,224,598 | B2 | 5/2007 | Perner ........................... 365/148 |
| 7,292,466 | B2 | 11/2007 | Nirschl ......................... 365/148 |
| 7,616,474 | B2 | 11/2009 | Baker ........................... 365/148 |
| 7,675,765 | B2 | 3/2010 | Derharcobian et al. ... 365/49.17 |
| 7,706,178 | B2 | 4/2010 | Parkinson ..................... 365/163 |
| 2006/0097342 | A1 | 5/2006 | Parkinson ..................... 257/528 |
| 2008/0068872 | A1 | 3/2008 | Lee et al. .................... 365/49.17 |
| 2010/0091559 | A1 | 4/2010 | Parkinson ..................... 365/163 |
| 2010/0169740 | A1 | 7/2010 | Jagasivamani et al. ........ 714/763 |
| 2010/0214819 | A1 | 8/2010 | Kim et al. ..................... 365/148 |
| 2010/0214829 | A1 | 8/2010 | Breitwisch et al. ........... 365/163 |
| 2010/0265748 | A1 | 10/2010 | Lam et al. .................... 365/49.17 |
| 2011/0026318 | A1 | 2/2011 | Franceschini et al. ........ 365/163 |
| 2011/0296258 | A1 | 12/2011 | Schechter et al. ............. 714/704 |
| 2012/0057417 | A1 | 3/2012 | An ........................... 365/189.16 |

OTHER PUBLICATIONS

Rajendran, B.; Cheek, RW.; Lastras, L.A.; Franceschini, M.M.; Breitwisch, M.J.; Schrott, A.G.; Jing Li; Montoye, R.K.; Chang, L.; Chung Lam; , "Demonstration of CAM and TCAM Using Phase Change Devices," Memory Workshop (IMW), 2011 3rd IEEE International, vol., No., pp. 1-4, May 22-25, 2011.

*Primary Examiner* — Cynthia Britt
(74) *Attorney, Agent, or Firm* — Ido Tuchman; Vazken Alexanian

(57) ABSTRACT

A system for programming a phase change material-content addressable memory (PCM-CAM). The system includes a receiving unit for receiving a word to be written in the PCM-CAM. The word includes low bits represented by a low resistance state in the PCM-CAM and high bits represented by a high resistance state in the PCM-CAM. The system includes a writing unit configured to repeatedly write the low bits in memory cells of the PCM-CAM until the resistance of the memory cells are below a threshold value, and to write high bits in memory cells of the PCM-CAM only once.

9 Claims, 5 Drawing Sheets

WRITING SCHEME FOR PHASE CHANGE MATERIAL-CONTENT ADDRESSABLE MEMORY

BACKGROUND

This invention relates to computer readable memory, and more particularly a writing scheme for phase change material-content addressable memory.

Content addressable memory (CAM) provides a hardware solution to the rapid search operations utilized in information networks, such as the internet. Unlike random access memory (RAM), which retrieves data from different locations in memory by a supplied address, CAMs search the entire memory for a supplied data word and returns the address and possibly associated data. This design offers a faster method for matching functions such as those performed by routers and network servers.

Most CAMs are based on volatile RAMs, such as dynamic RAM (DRAM) and static RAM (SRAM). However, the present invention is directed to CAMs utilizing phase change memory technology, or phase change memory-content addressable memory (PCM-CAM). Due to advances in non-volatile memory, the use of phase change memory provides significant advantages in scalability.

In phase change memory, information is stored in materials that can be manipulated into different phases. Each of these phases exhibit different electrical properties which can be used for storing information. The amorphous and crystalline phases are typically two phases used for bit storage (1's and 0's, respectively) since they have detectable differences in electrical resistance. Specifically, the amorphous phase has a higher resistance than the crystalline phase.

Chalcogenides are a group of materials commonly utilized as phase change material. This group of materials contain a chalcogen (Periodic Table Group 16/VIA) and another element. Selenium (Se) and tellurium (Te) are the two most common semiconductors in the group used to produce a chalcogenide when creating a phase change memory cell. An example of this would be $Ge_2Sb_2Te_5$ (GST), SbTe, and $In_2Se_3$.

Advancements in non-volatile memory technology are greatly driven by the desirability of scaling down memory devices. As the dimensions of the phase change memory elements are minimized, there exists an increasing difficulty in crystallizing the phase change material to provide a low resistance state (low bit). This difficulty does not extend to producing the amorphous high resistance state (high bit). However, difficulty in crystallization provides the issue of narrowing the sensing window between a high bit and low bit.

BRIEF SUMMARY

One aspect of the invention is a system for programming a PCM-CAM. The system includes a receiving unit for receiving a word to be written in the PCM-CAM. The word includes low bits represented by a low resistance state in memory cells and high bits represented by a high resistance state in memory cells. The system also includes a writing unit configured to repeatedly write the low bits in memory cells of the PCM-CAM until the resistance of the memory cells are below a threshold value, and to write high bits in memory cells of the PCM-CAM only once.

Another aspect of the invention is a method for programming a PCM-CAM. The method includes receiving a word to be written in the PCM-CAM. The method includes repeatedly writing low bits in memory cells of the PCM-CAM until the resistance of the memory cells are below a threshold value. The method includes writing high bits in memory cells of the PCM-CAM only once.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention, but shall not be limited to the referenced embodiments. Throughout the description of the present invention, references are made to FIGS. 1 through 5.

Embodiments of the present invention provide possible systems for programming Phase Change Material-Content Addressable Memory (PCM-CAM) and possible methods for programming such a system. An aspect of the present invention provides a feedback loop for controlling the writing of low resistance bits in PCM-CAM. Such a mechanism is advantageous in providing a higher on-off ratio and improved reliability in programming PCM-CAM.

Figure 1:
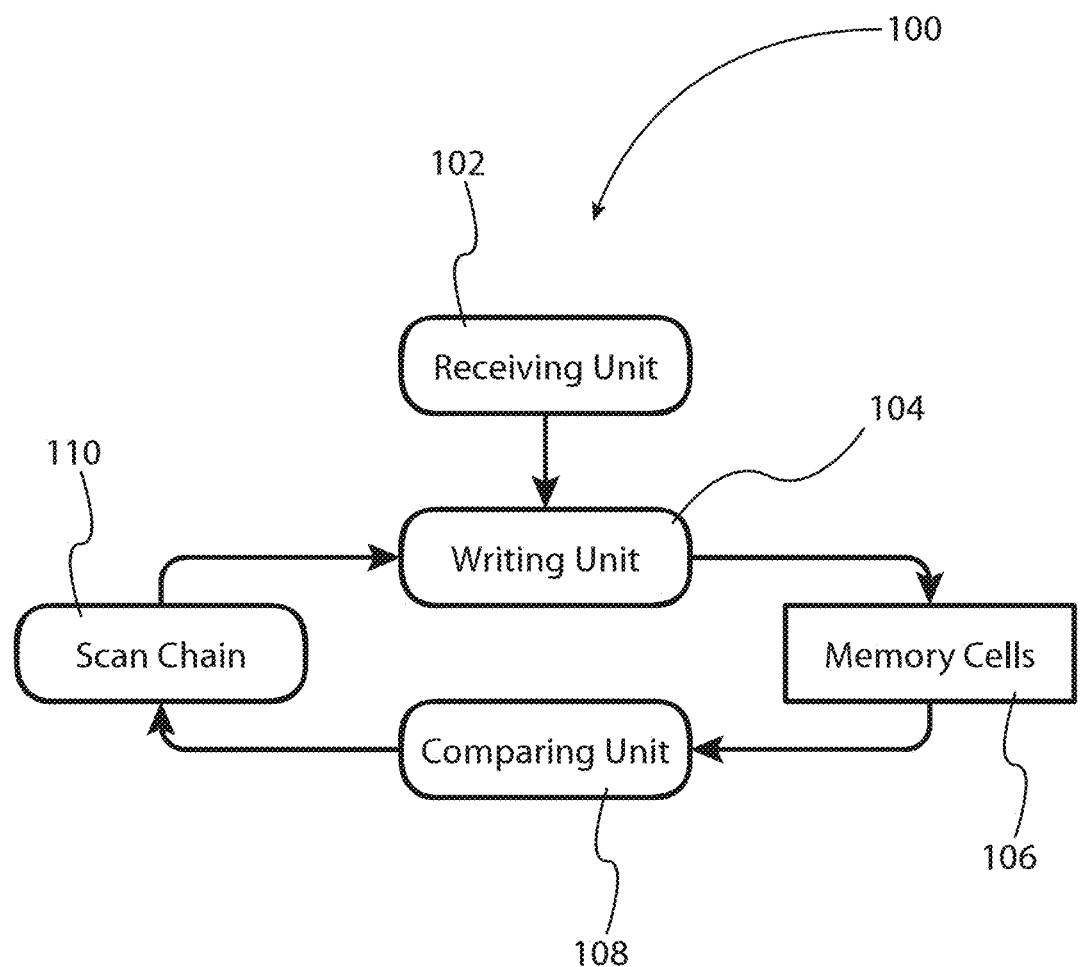
FIG. 1 is a block diagram of an example PCM-CAM system in accordance to one embodiment of the present invention.

FIG. 1 is a block diagram of an example PCM-CAM system 100 in accordance to one embodiment of the present invention. The system includes a receiving unit 102, wherein the receiving unit 102 receives a word to be written in the PCM-CAM. The word includes low bits representing a low resistance state in the PCM-CAM, and high bits representing a high resistance state in the PCM-CAM. In some embodiments, the low resistance state is a binary "0" representation and the high resistance state is a binary "1" representation. In some embodiments, the resistance of the high resistance state is at least one order of magnitude higher than that of the low resistance state.

The system also includes a writing unit 104 configured to write low bits and high bits in memory cells 106 of the PCM-CAM. The writing unit 104 is configured to write the high bits once, in parallel. The writing unit 104 is configured to repeatedly write the low bits. In one embodiment of the invention, the memory cells 106 may include $Ge_2Sb_2Te_5$. The phase change memory cells may include $Sb_xTe_{1-x}$ material, where 0.4 ($Sb_2Te_3$)<=x<=0.7 ($Sb_7Te_3$). The phase change memory cells may include $In_2Se_3$.

The system also includes a comparing unit 108, wherein the comparing unit 108 compares the resistance of the memory cells written as low bits to a threshold value. The comparing unit 108 determines a failure-signature, wherein the failure-signature is a binary word that contains data of which memory cells measured above the threshold value. The failure-signature is latched to a scan chain 110. In some embodiments the latched failure-signature is tested and output serially.

Figure 2:
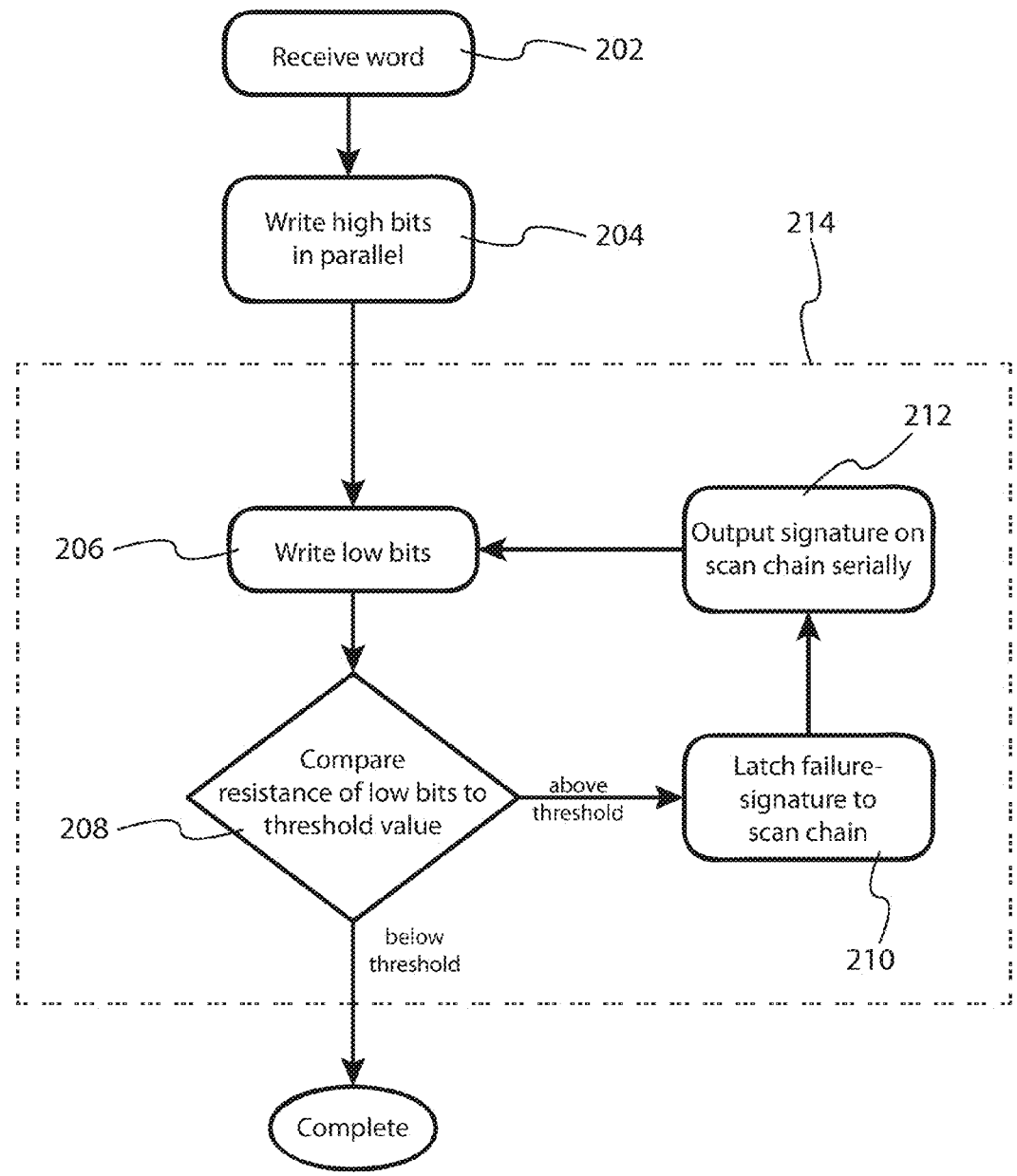
FIG. 2 is a flowchart illustrating an example method for programming a PCM-CAM in accordance to one embodiment of the present invention.

FIG. 2 is a flowchart illustrating an example method for programming a PCM-CAM in accordance to one embodiment of the present invention. The method begins with receiving step 202. At receiving step 202, the receiving unit 102 receives the word to be written in the PCM-CAM. After receiving step 202 completes, the method continues to writing step 204.

At writing step 204, the writing unit 104 writes the high bits in the word, in parallel. After writing step 204 completes, the method continues to writing step 206.

At writing step 206, the writing unit 104 writes the low bits in the word. After writing step 206 completes, the method continues to comparing step 208.

At comparing step 208, the comparing unit 108 compares the resistance of the written low bits to the threshold value. The comparing unit 108 determines a failure-signature. If one or more memory cells written as low bits are above the threshold value, the method proceeds to latching step 210.

At latching step 210, the failure-signatures are latched to a scan chain. After latching step 210 completes, the method continues to output step 212.

At output step 212, the failure-signatures on the scan chain are output serially into the writing unit 104, to determine which memory cells to rewrite. After latching step 210, the method continues to repeat feedback loop 214, until comparing step 208 yields that all memory cells written as low bits are below the threshold value.

Feedback loop 214 includes writing step 206, comparing step 208, latching step 210, and output step 212. If the resistance of all memory cells written as low bits are below the threshold value, the method is complete.

Figure 3:
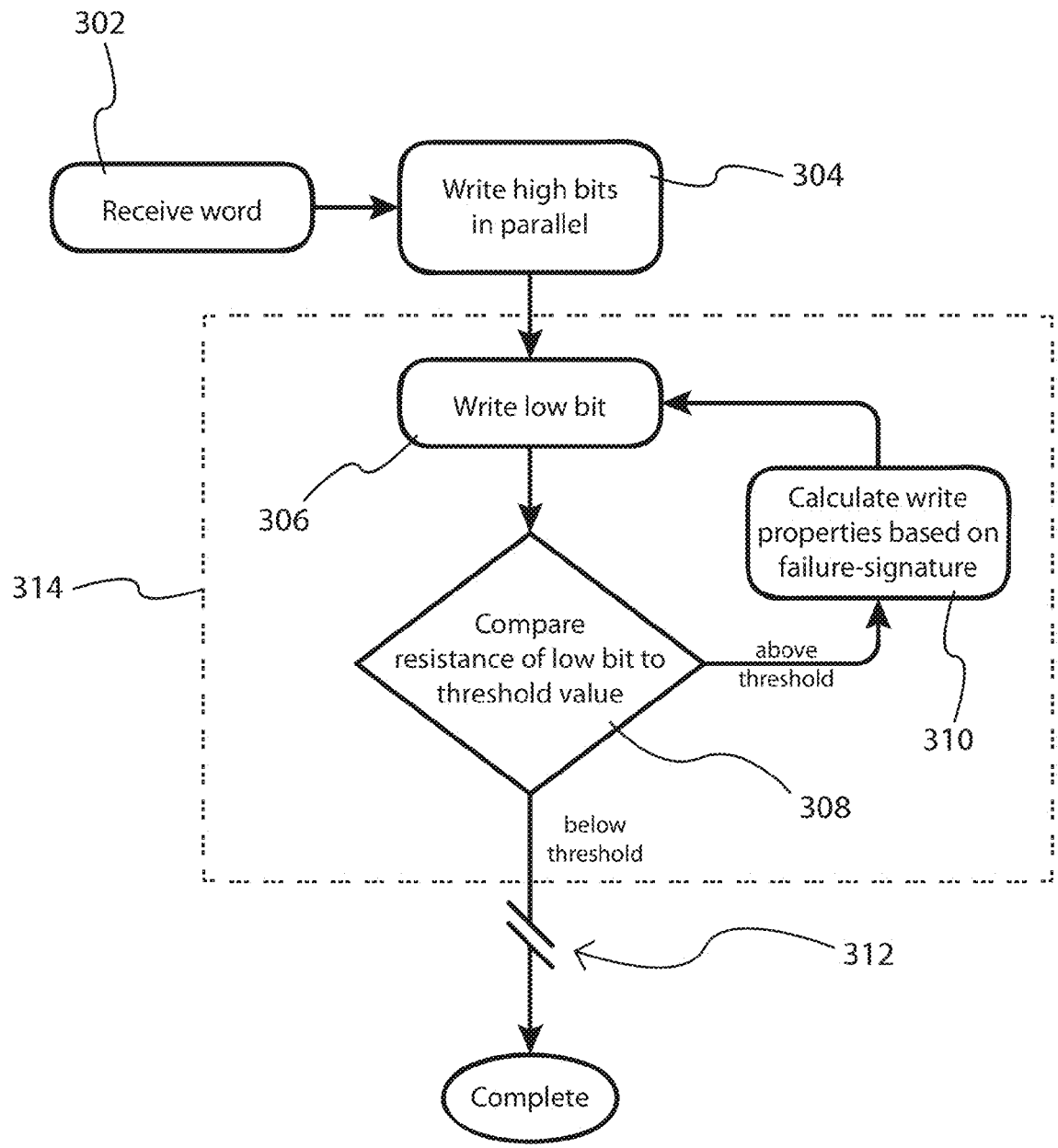
FIG. 3 is a flowchart illustrating an example method for programming a PCM-CAM in accordance to one embodiment of the present invention.

FIG. 3 is a flowchart illustrating an example method for programming a PCM-CAM in accordance to one embodiment of the present invention. The method begins with receiving step 302. At receiving step 302, the receiving unit 102 receives the word to be written in the PCM-CAM. After receiving step 302, the method continues to writing step 304.

At writing step 304, the writing unit 104 writes the high bits in the word, in parallel. After writing step 304 completes, the method continues to writing step 306.

At writing step 306, the writing unit 104 writes a low bit in the word. After writing step 306 completes, the method continues to comparing step 308.

At comparing step 308, the comparing unit 108 compares the resistance of the written low bit to the threshold value. The comparing unit 108 determines a failure-signature. If the resistance of the written memory cell is above the threshold value, the method continues to calculating step 310.

At calculating step 310, the write properties are determined from the failure-signature. The write properties include write pulse length and write pulse intensity. After calculating step 310 completes, the method continues to repeat feedback loop 314, until comparing step 308 yields that the resistance of the memory cell written as the low bit is below the threshold value.

Feedback loop 314 includes writing step 306, comparing step 308, and calculating step 310. If the resistance of the memory cell written as a low bit is below the threshold value, the method continues to step 312.

Step 312 represents the method proceeding with feedback loop 314 on the next memory cell to be written as a low bit, until all the low bits in the word are written. After feedback loop 314 has written all the low bits in the word, the method is complete.

Figure 4:
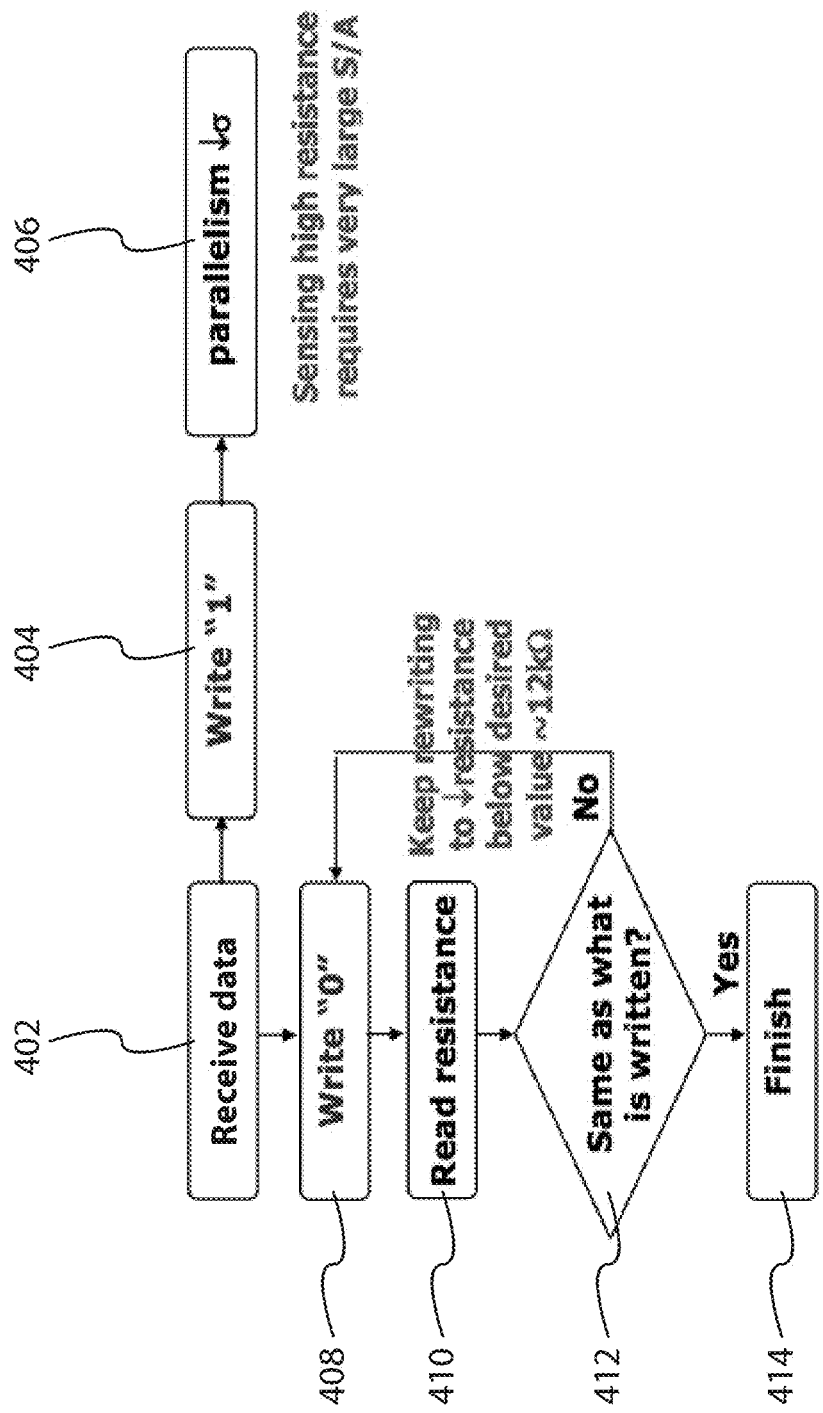
FIG. 4 is a flowchart illustrating an example method for programming a PCM-CAM in accordance to one embodiment of the present invention.

FIG. 4 is a flowchart illustrating an example method for programming a PCM-CAM in accordance to one embodiment of the present invention. The method begins with receiving step 402. In receiving step 402, the receiving unit 102 receives the word to be written in the PCM-CAM. After receiving step 402, the method continues to writing steps 404 and 408, depending on whether the memory cells to be written are high bits or low bits, respectively.

At writing step 404, the writing unit 104 writes the high bits in the word simultaneously, in parallel. Item 406 indicates that high bits are written with little variation in resistance, with respects to the low bits.

At writing step 408, the writing unit 104 writes the low bits in the word. After writing step 408, the method continues to reading step 410.

At reading step 410, the resistances of the written low bits are read. After reading step 410, the method continues to comparing step 412.

At comparing step 412, the comparing unit 108 compares the resistance of the written low bits to the threshold value. If the resistance of one or more memory cells written as low bits is above the threshold value, the method continues to writing step 408. If the resistances of all written low bits are below the threshold value, the method is complete.

Figure 5:
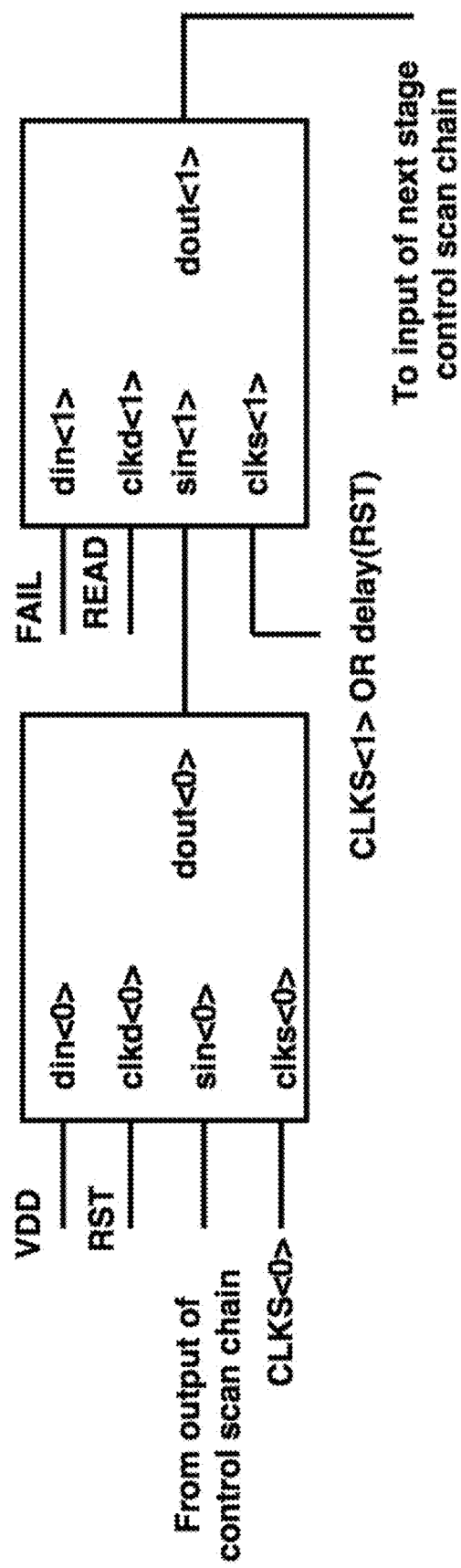
FIG. 5 is a diagram of an example circuit system for programming a PCM-CAM in accordance to one embodiment of the present invention.

FIG. 5 is a diagram of an example circuit implementation for programming a PCM-CAM in accordance to one embodiment of the present invention. The circuit includes a reset line (RST), wherein the RST initializes the latch output to the power supply (VDD). The circuit also includes a read line (READ), wherein the READ provides a timing signal for the read operation. The circuit includes a fail line (FAIL), wherein the FAIL provides the failure-signature signal for low bits above the threshold value. The circuit includes scan clock lines (CLKS<0> and CLKS<1>), wherein the scan clocks scan data out serially.

The circuit implementation latches the failure-signature to a scan chain and scans out the data serially. Such a circuit provides a method of rewriting the low bits until the resistances are below the threshold value.

Another embodiment of the invention is a method for programming a Phase Change Material-Content Addressable Memory (PCM-CAM). The method includes receiving a word to be written in a PCM-CAM, the word including low bits represented by a low resistance state in the PCM-CAM and high bits represented by a high resistance state in the PCM-CAM; repeatedly writing the low bits in memory cells of the PCM-CAM until the resistance of the memory cells are below a threshold value; and writing the high bits in memory cells of the PCM-CAM only once. The method may include comparing the resistance of the memory cells with written low bits to the threshold value. A failure-signature may be determined by the comparing step, the failure-signature being a binary word that includes the data of which memory cells require rewriting. A write length and intensity may be determined for each repeated write cycle, based on the failure-signature. The method may include latching the failure-signature onto a scan chain. The method may include successively testing failure-signatures latched on the scan chain. The method may include clocking the scan chain such that failure-signatures are output from the scan chain serially. The high bits may be written simultaneously, in parallel. The low resistance state may be a binary "0" representation and the high resistance state is a binary "1" representation. The resistance of the high resistance state may be at least one order of magnitude higher than that of the low resistance state.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Having described preferred embodiments for a system for programming PCM-CAM and the method for programming PCM-CAM (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A system for programming a Phase Change Material-Content Addressable Memory (PCM-CAM) comprising:
 a receiving unit for receiving a word to be written in a PCM-CAM, the word including low bits represented by a low resistance state in the PCM-CAM and high bits represented by a high resistance state in the PCM-CAM; and
 a writing unit configured to repeatedly write the low bits in memory cells of the CAM-PCM until the resistance of the memory cells are below a threshold value and to write high bits in the memory cells of the CAM-PCM only once.

2. The system of claim 1, wherein the CAM is a ternary content addressable memory (TCAM).

3. The system of claim 1, further comprising a comparing unit for comparing the resistance of the low bits to the threshold value.

4. The system of claim 3, wherein the comparing unit determines a failure-signature, the failure-signature being a binary word that includes the data of which memory cells require rewriting.

5. The system of claim 4, further comprising a scan chain for latching the failure-signature.

6. The system of claim 5, wherein the failure-signatures latched in the scan chain are tested successively.

7. The system of claim 1, wherein the memory cells include $Ge_2Sb_2Te_5$.

8. The system of claim 1, wherein the memory cells include SbTe materials.

9. The system of claim 1, wherein the memory cells include $In_2Se_3$.

* * * * *